US 6,729,888 B2

(12) United States Patent
Imaeda

(10) Patent No.: US 6,729,888 B2
(45) Date of Patent: May 4, 2004

(54) CONNECTING STRUCTURE, ELECTRO-OPTICAL DEVICE, AND ELECTRONIC APPARATUS

(75) Inventor: Chiaki Imaeda, Hotaka-machi (JP)

(73) Assignee: Seiko Epson Corporation (JP)

( * ) Notice: Subject to any disclaimer, the term of this patent is extended or adjusted under 35 U.S.C. 154(b) by 1 day.

(21) Appl. No.: 09/730,382

(22) Filed: Dec. 5, 2000

(65) Prior Publication Data

US 2001/0012706 A1 Aug. 9, 2001

(30) Foreign Application Priority Data

Dec. 10, 1999 (JP) .......................................... 11-351966
Oct. 23, 2000 (JP) ..................................... 2000-322913

(51) Int. Cl.[7] ................................................ H01R 9/09
(52) U.S. Cl. .......................................... 439/66; 439/67
(58) Field of Search ............................. 439/66, 67, 70; 349/149, 150, 58; 361/400

(56) References Cited

U.S. PATENT DOCUMENTS

| 3,991,463 A | * | 11/1976 | Squitieri et al. ............. 29/883 |
| 3,998,513 A | * | 12/1976 | Kobayashi et al. ........... 439/91 |
| 4,012,117 A | * | 3/1977 | Lazzery ...................... 349/149 |
| 4,201,435 A | * | 5/1980 | Nakamura et al. .......... 206/318 |
| 5,122,064 A | * | 6/1992 | Zarreii ......................... 439/65 |
| 5,138,528 A | * | 8/1992 | Altman et al. ......... 174/DIG. 2 |
| 5,675,397 A | * | 10/1997 | Fukushima ................. 349/149 |
| 6,025,644 A | | 2/2000 | Imaeda |
| 6,191,838 B1 | * | 2/2001 | Muramatsu ................. 349/149 |

FOREIGN PATENT DOCUMENTS

| JP | 9-318967 | 12/1997 |
| JP | 11-317252 | 11/1999 |

* cited by examiner

*Primary Examiner*—Neil Abrams
*Assistant Examiner*—Phuong Dinh
(74) *Attorney, Agent, or Firm*—Harness, Dickey & Pierce, P.L.C.

(57) ABSTRACT

A connecting structure includes a substrate board 104 provided with terminals 117, an elastic conductive member 116 provided with conductive sections 116b connected to the terminals 117. The conductive sections 116b are connected to the conductive terminals 117 with a hardened conductive paste therebetween, and when the conductive member 116 are interposed between the substrate 104 and a flexible wiring board 115 provided with the terminals 115a, the conductive sections 116b are pressed onto the terminals 115a by resilience due to elastic deformation of the conductive members 116, thereby electrically connecting the terminals 117 and the terminals 115a to each other.

21 Claims, 12 Drawing Sheets

(a)

(b)

(c)

(a)

(b)

(a)

(b)

CONNECTING STRUCTURE, ELECTRO-OPTICAL DEVICE, AND ELECTRONIC APPARATUS

BACKGROUND OF THE INVENTION

1. Technical Field of the Invention

The present invention relates to a connecting structure in which an electrical connection is made between terminals by an elastic conductive member interposed between the terminals, and relates to an electro-optical device including such a connecting structure.

2. Description of the Related Art

For example, a method is known as a mounting technique for a liquid crystal display device, in which a rubber connector is used, the rubber connector including an elastic body, such as a rubber, and a conductor embedded in the elastic body or provided around the elastic body. In such a mounting technique, the rubber connector is inserted between a terminal of one substrate and a terminal of another substrate, and by supporting the rubber connector by applying a pressure so as to press both substrates using resilience of the elastic body of the rubber connector, the conductor is brought into contact with the terminals. Thus, the terminals can be electrically connected to each other with the conductor therebetween.

The mounting method using the rubber connector is advantageous because it is not necessary to use a soldering or thermal compression process in order to form a connection between the terminals, which is necessary when soldering or an anisotropic conductive film (ACF) is used. However, since the rubber connector is supported while being interposed between the terminals, the rubber connector may be shifted or detached due to impact, resulting in insufficient reliability in the connecting area.

It therefore is an object of the present invention to improve reliability in a connecting structure in which an electrical connection is made between terminals using an elastic conductive member, such as a rubber connector.

SUMMARY OF THE INVENTION

In order to achieve the object described above, in accordance with the present invention, a connecting structure includes a first substrate provided with a first terminal and an elastic conductive member including a conductive section connected to the first terminal. The conductive section is connected to the first terminal with a conductive adhesive therebetween. The conductive member is interposed between the first substrate and a second substrate provided with a second terminal, and the conductive section is connected to the second terminal.

In such a connecting structure, since the conductive section is connected to the first terminal with the conductive adhesive therebetween, even if an impact is applied, the conductive member is not detached or shifted, and the connection is stable. Thus, it is possible to improve the reliability of the electrical connection. Also, since the connecting area is covered by the conductive adhesive, it is possible to efficiently inhibit changes of the connection over time.

In order to achieve the object described above, in accordance with the present invention, a connecting structure includes a first substrate provided with a first terminal, a second substrate provided with a second terminal, and an elastic conductive member including a conductive section connected to the first terminal. The conductive section is connected to the first terminal with a conductive adhesive therebetween, the conductive member is interposed between the first substrate and the second substrate, and the conductive section is connected to the second terminal.

In such a connecting structure, since the conductive section is connected to the first terminal with the conductive adhesive therebetween, even if an impact is applied, the conductive member is not detached or shifted, and the connection is stable. Thus, it is possible to improve the reliability of the electrical connection. Also, since the connecting area is covered by the conductive adhesive, it is possible to efficiently inhibit changes of the connection over time.

Preferably, in either connecting structure described above, the conductive section is pressed onto the second terminal by resilience due to elastic deformation of the conductive member so that the conductive section is connected to the second terminal, thereby electrically connecting the first terminal and the second terminal to each other.

The conductive member may include an elastic insulating section, and the insulating section may be provided on the periphery of the conductive section.

The conductive member may include an elastic insulating section, and the conductive section may be embedded in the insulating section.

The conductive adhesive may be a hardened conductive paste. The conductive paste may be hardened by heat or may be hardened by irradiation of light, such as ultraviolet light.

The conductive paste may be an isotropic conductive paste.

The conductive paste may be an anisotropic conductive paste.

When the conductive paste is used, the connecting structure may be fabricated by a method including the steps of applying the conductive paste on the first terminal and hardening the conductive paste while the conductive member is pressed onto the first terminal.

When an isotropic conductive paste is used as the conductive paste, the conductive paste is applied in a shape corresponding to the shape of the first terminal. When an anisotropic paste is used as the conductive paste, the conductive paste may be applied to the region containing the first terminal so as to cover the first terminal.

The conductive adhesive may be an anisotropic conductive film.

When the anisotropic conductive film is used, the connecting structure may be fabricated by a method including the steps of placing the conductive film on the first terminal, and hardening or curing the anisotropic conductive film while the conductive member is pressed onto the first terminal with the anisotropic conductive film therebetween. The anisotropic conductive film may contain a thermosetting resin as a resin binder and may contain a thermoplastic resin as a resin binder.

In such a case, after the conductive film is applied to the region containing the first terminal so as to cover the first terminal, by heating the anisotropic conductive film while the conductive member is pressed onto the first terminal, the conductive member can be bonded to the first substrate by thermal compression. When the anisotropic conductive film contains a thermosetting resin as the resin binder, the resin binder is hardened during the thermal compression. When the anisotropic conductive film contains a thermoplastic resin as the resin binder, the resin binder is melted by heat during the thermal compression and then is cooled to be hardened.

The first substrate may be a substrate constituting an electro-optical panel.

In order to achieve the object described above, in accordance with the present invention, an electro-optical device includes a substrate constituting an electro-optical panel, and an elastic conductive member including a conductive section connected to a terminal provided on the substrate. The conductive section is connected to the terminal with a conductive adhesive therebetween.

In such an electro-optical device, since the conductive section is connected to the first terminal with the conductive adhesive therebetween, even if an impact is applied, the conductive member is not detached or shifted, and the connection is stable. Thus, it is possible to improve the reliability of the electrical connection. Also, since the connecting area is covered by the conductive adhesive, it is possible to efficiently inhibit changes of the connection over time.

In order to achieve the object described above, in accordance with the present invention, an electro-optical device includes a first substrate constituting an electro-optical panel, a second substrate provided with a second terminal, and an elastic conductive member including a conductive section connected to a first terminal provided on the first substrate. The conductive section is connected to the first terminal with a conductive adhesive therebetween, the conductive member is interposed between the first substrate and the second substrate, and the conductive section is connected to the second terminal.

In such an electro-optical device, since the conductive section is connected to the first terminal with the conductive adhesive therebetween, even if an impact is applied, the conductive member is not detached or shifted, and the connection is stable. Thus, it is possible to improve the reliability of the electrical connection. Also, since the connecting area is covered by the conductive adhesive, it is possible to efficiently inhibit changes of the connection over time.

In the electro-optical device, the conductive section is pressed onto the second terminal by resilience due to the elastic deformation of the conductive member so that the conductive section is connected to the second terminal, thereby electrically connecting the first terminal and the second terminal to each other.

The conductive member may include an elastic insulating section, and the insulating section may be provided on the periphery of the conductive section.

The conductive member may include an elastic insulating section, and the conductive section may be embedded in the insulating section.

The conductive adhesive may be a hardened conductive paste. The conductive paste may be hardened by heat or may be hardened by irradiation of light, such as ultraviolet light.

The conductive paste may be an isotropic conductive paste.

The conductive paste may be an anisotropic conductive paste.

When the conductive paste is used, the electro-optical device may be fabricated by a method including the steps of applying the conductive paste on the first terminal and hardening the conductive paste while the conductive member is pressed onto the first terminal.

When an isotropic conductive paste is used as the conductive paste, the conductive paste is applied in a shape corresponding to the shape of the first terminal. When an anisotropic paste is used as the conductive paste, the conductive paste may be applied to the region containing the first terminal so as to cover the first terminal.

The conductive adhesive may be an anisotropic conductive film.

When the anisotropic conductive film is used, the electro-optical device may be fabricated by a method including the steps of placing the conductive film on the first terminal, and hardening or curing the anisotropic conductive film while the conductive member is pressed onto the first terminal with the anisotropic conductive film therebetween. The anisotropic conductive film may contain a thermosetting resin as a resin binder and may contain a thermoplastic resin as a resin binder.

In such a case, after the conductive film is applied to the region containing the first terminal so as to cover the first terminal, by heating the anisotropic conductive film while the conductive member is pressed onto the first terminal, the conductive member can be bonded to the first substrate by thermal compression. When the anisotropic conductive film contains a thermosetting resin as the resin binder, the resin binder is hardened during the thermal compression. When the anisotropic conductive film contains a thermoplastic resin as the resin binder, the resin binder is melted by heat during the thermal compression and then is cooled to be hardened.

In order to achieve the object described above, in accordance with the present invention, an electronic apparatus includes any one of electro-optical devices described above.

BRIEF DESCRIPTION OF THE DRAWINGS

FIG. 4(a) is a perspective view showing a conductive member used in the connecting structure in the first embodiment; FIG. 4(b) is a perspective view showing another conductive member; and FIG. 4(c) is a perspective view showing another conductive member.

FIG. 5(a) is a perspective view which shows the periphery of the conductive member; FIG. 5(b) is a sectional view taken along the line B—B of FIG. 5(a); and FIG. 5(c) show a case in which an anisotropic conductive film is used.

FIG. 7(a) is a sectional view of the liquid crystal display device; and FIG. 7(b) is a partial enlarged view of FIG. 7(a).

FIG. 8(a) is a perspective view showing a rubber connector; and FIG. 8(b) is a perspective view showing a case in which the rubber connector is bonded by an anisotropic conductive film.

FIG. 10(a) is a plan view of the spring connector;

FIG. 10(b) is a bottom plan view of the spring connector; and FIG. 10(c) is a sectional view taken along the line X—X of FIG. 10(a).

FIG. 11(a) is a sectional view of the spring connector in accordance with FIG. 7(b); FIG. 11(b) is a diagram viewed from the line B—B of FIG. 11(a); and FIG. 11(c) is a diagram which shows a case in which an anisotropic conductive film is used instead of an isotropic conductive paste.

DETAILED DESCRIPTION OF THE PREFERRED EMBODIMENTS

First Embodiment

A connecting structure in a first embodiment of the present invention will be described with reference to FIGS. 1 to 5.

Figure 1:
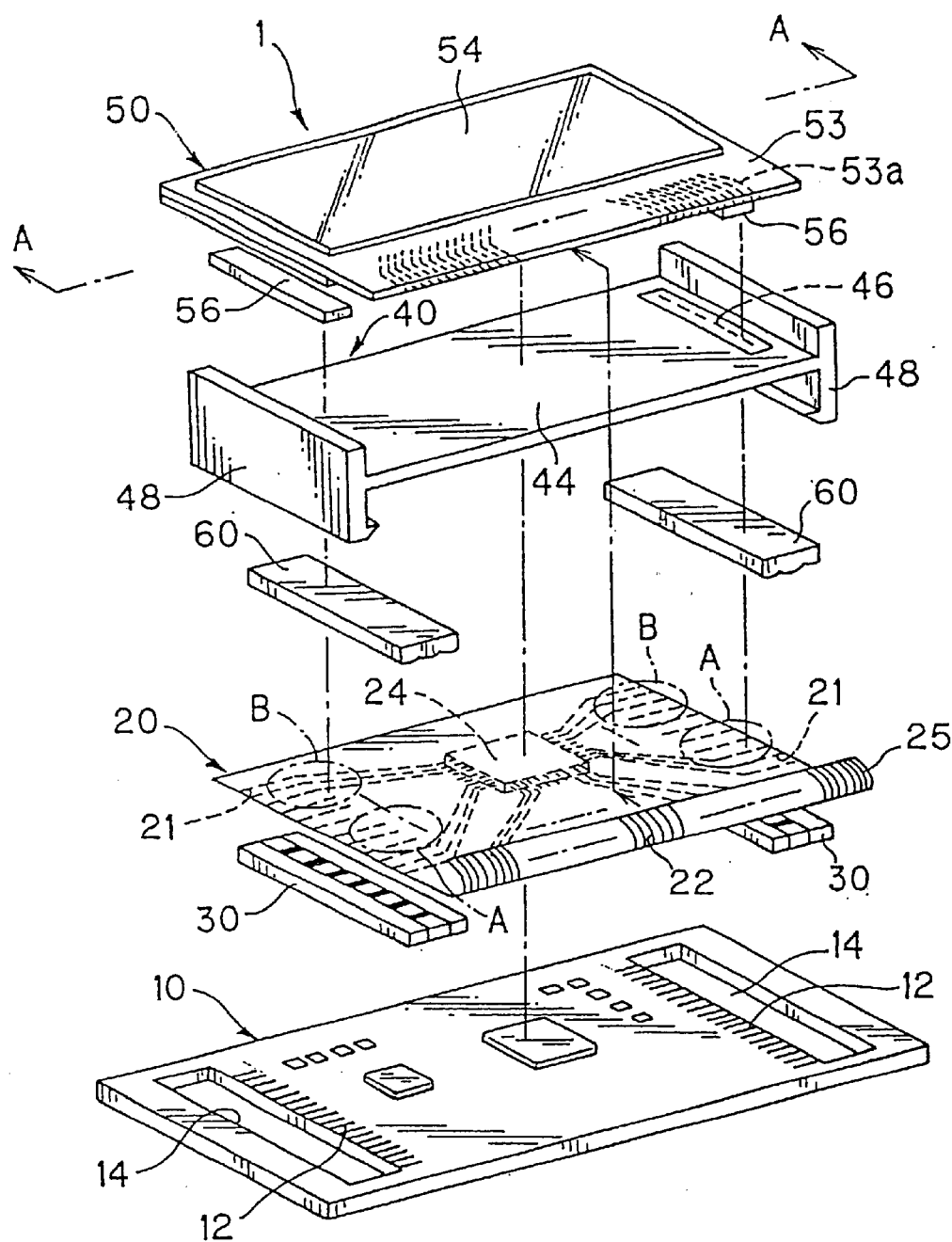
FIG. 1 is an assembly view showing a liquid crystal display device in which a connecting structure of the present invention is used.
Figure 2:
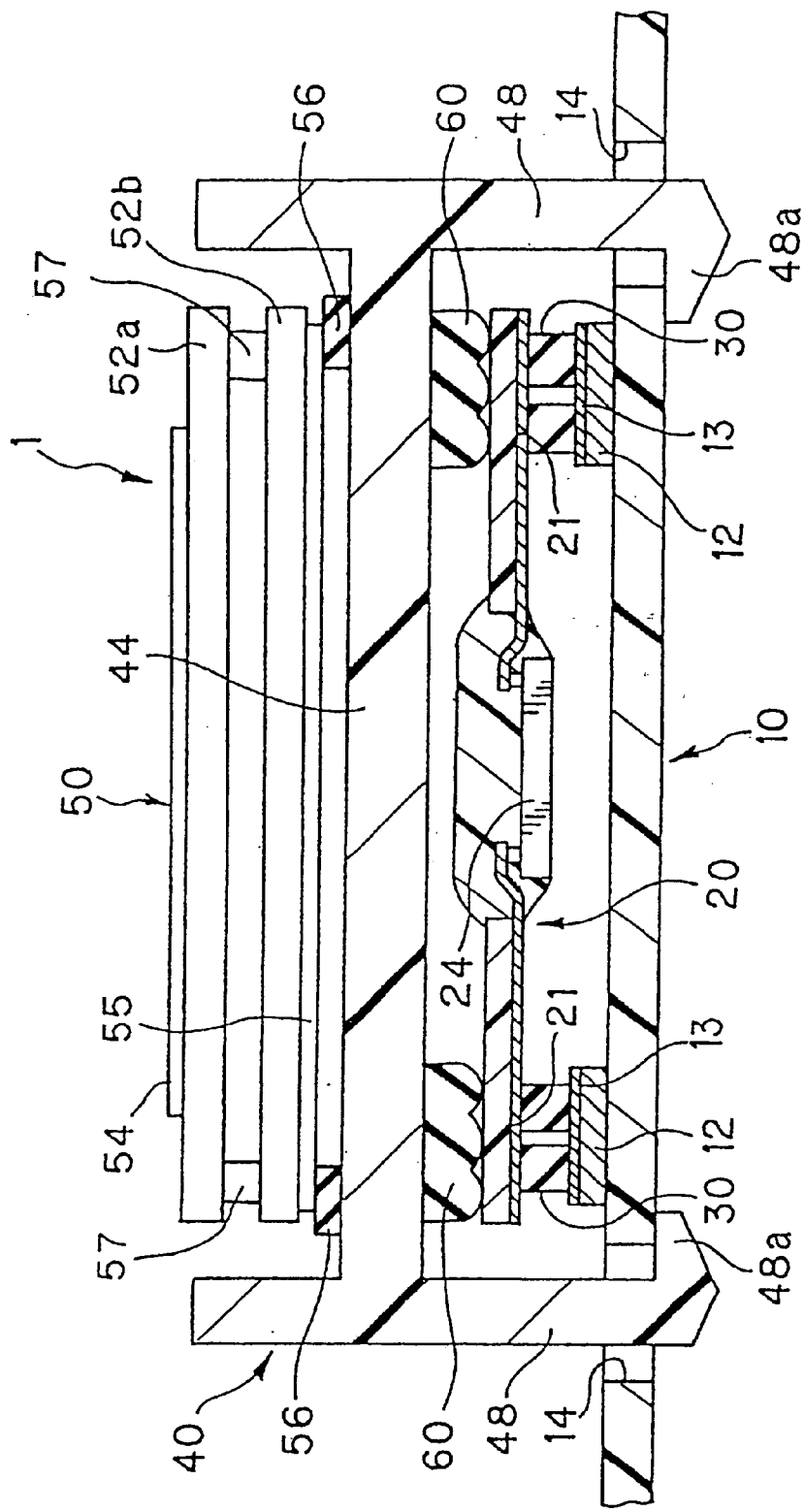
FIG. 2 is a partial sectional view taken along the line A—A of FIG. 1.

FIG. 1 is an assembly view showing a liquid crystal display device in which a connecting structure of the present invention is used, and FIG. 2 is a partial sectional view taken along the line A—A of FIG. 1.

A liquid crystal display device 1 includes a circuit board 10; a flexible wiring board 20; two conductive members 30; a structural member 40 including a light source 46, such as an LED, and a light guide 44 as a backlight; a liquid crystal display panel 50; and a spacer member 60 provided in a metallic frame (not shown in the drawing). The two conductive members 30 and the flexible wiring board 20 electrically connect the liquid crystal display panel 50 and the circuit board 10 to each other. The liquid crystal display panel 50 includes a pair of substrates 52a and 52b, and the substrate 52a and the substrate 52b are bonded to each other with a sealant 57 therebetween.

Figure 3:
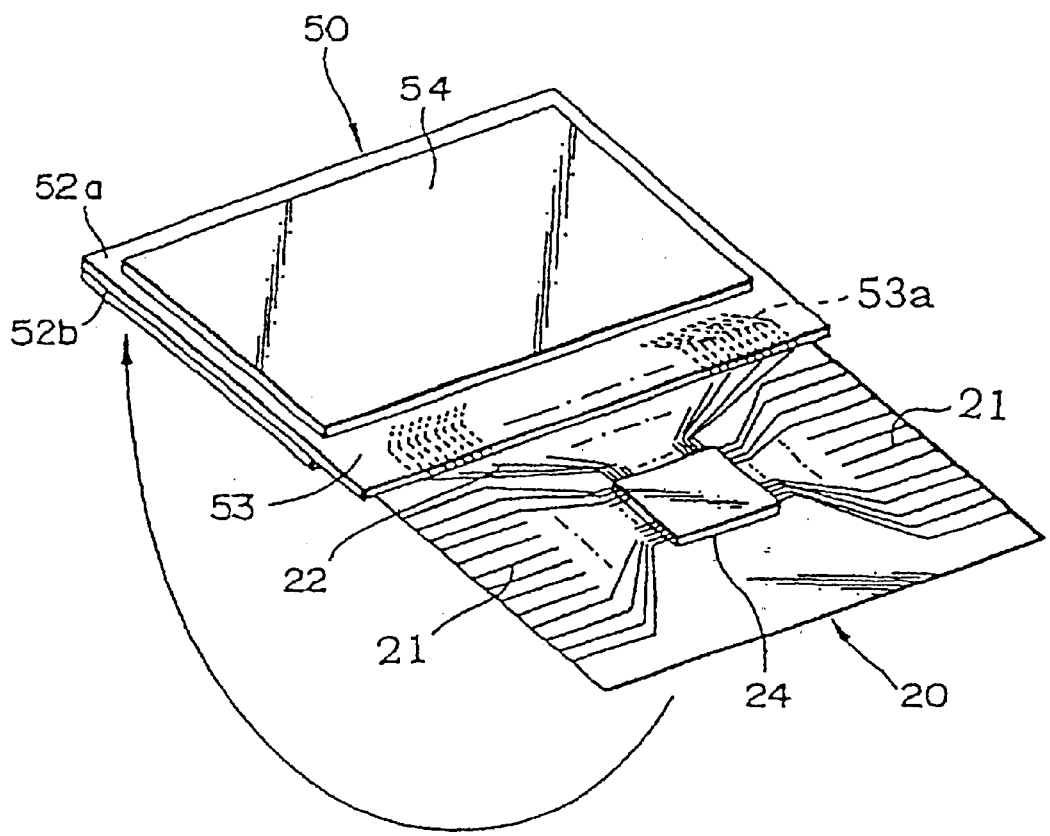
FIG. 3 is a perspective view showing a liquid crystal display panel 50 and a flexible wiring board 20 connected to the liquid crystal display panel 50.
Figure 4:
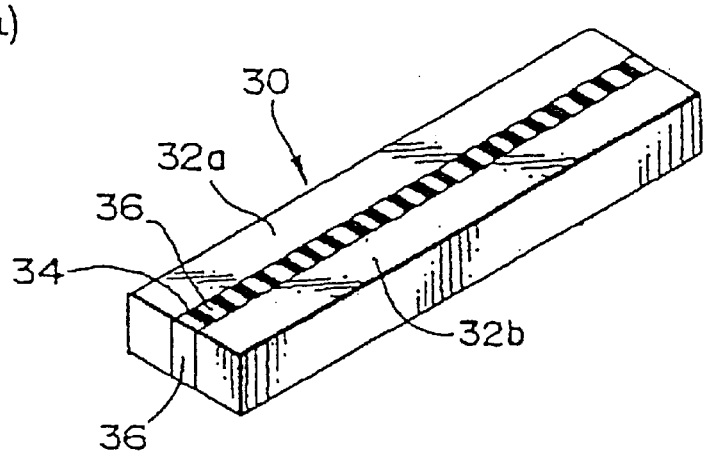
FIGS. 4(a) to 4(c) are diagrams showing various types of conductive members.
Figure 4:
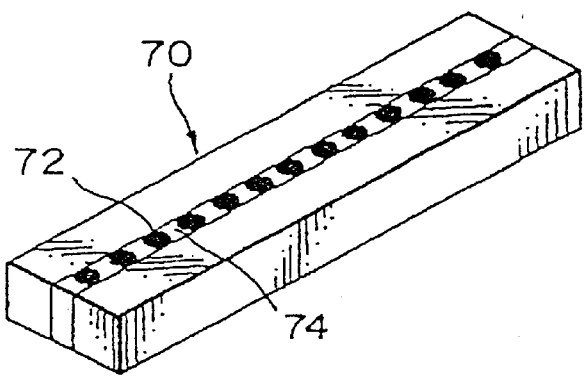
Figure 4:
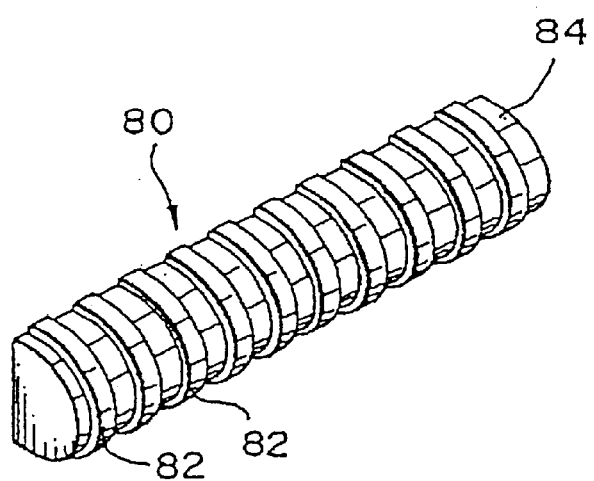
Figure 5:
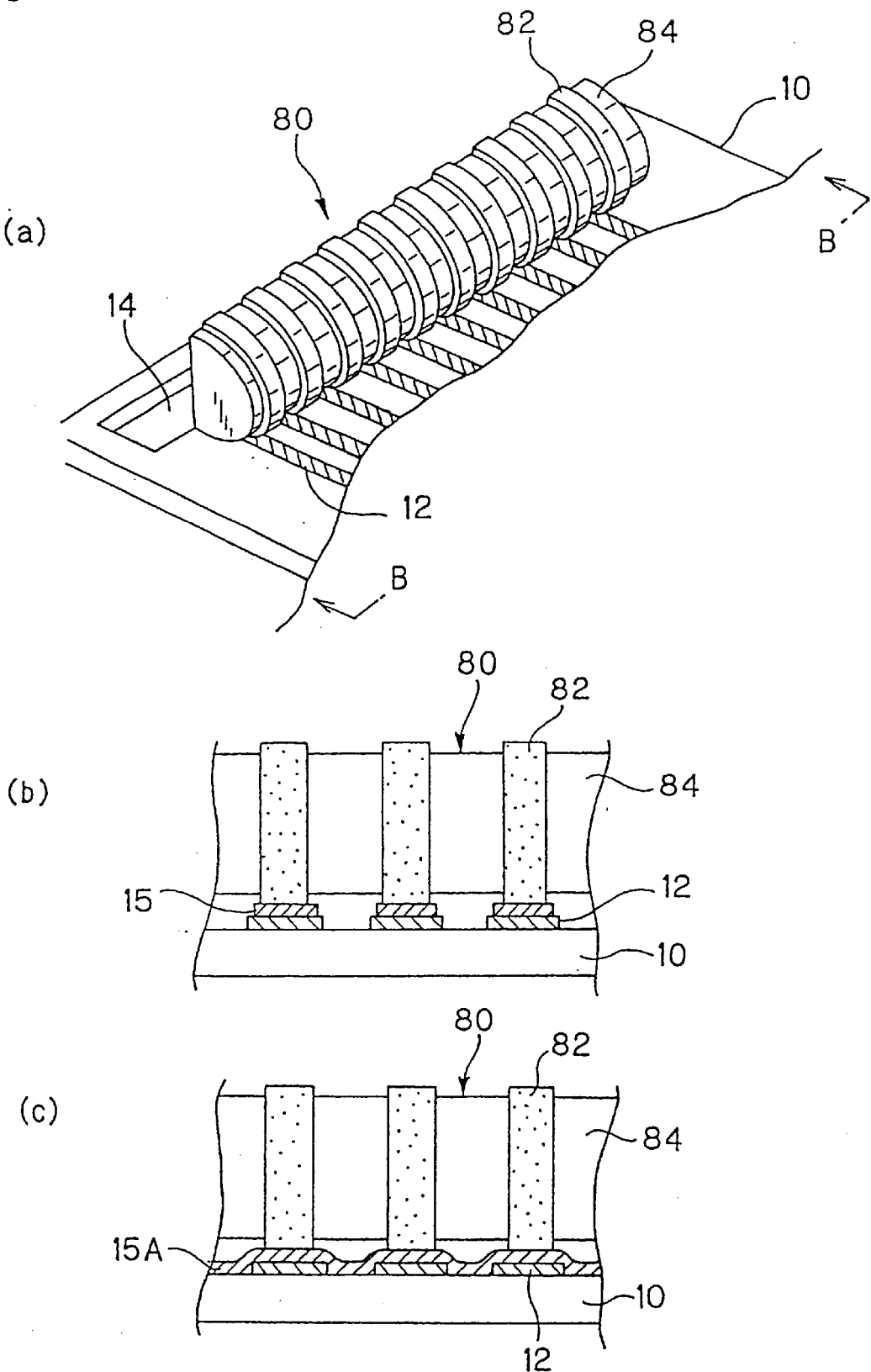
FIGS. 5(a) to 5(c) are diagrams showing states in which conductive members are bonded to circuit boards.

FIG. 3 is a perspective view showing the liquid crystal display panel 50 and the flexible wiring board 20 connected to the liquid crystal display panel 50. As shown in FIGS. 1 to 3, the flexible wiring board 20 includes conductive terminals 21 provided along both ends which are opposed to each other and conductive terminals 22 provided along another end. The transparent substrate 52a constituting the liquid crystal display panel 50 is provided with an extended section 53 which extends further than the other transparent substrate 52b, and conductive terminals 53a are formed on the extended section 53. The conductive terminals 22 are connected to the conductive terminals 53a, thus constituting a so-called "COF (Chip On Film)" type liquid crystal display device. The conductive terminals 53a of the liquid crystal panel 50 are connected to the conductive terminals 22 of the flexible wiring board 20 by thermal compression with an anisotropic conductive film (ACF) therebetween. The anisotropic conductive film is formed, for example, by dispersing metallic particles, such as nickel or solder, or elastic plastic particles plated with a metal in a thermosetting adhesive.

The flexible wiring board 20 is used by being folded as shown by an arrow in FIG. 3. FIG. 1 shows the state after the flexible wiring board 20 is folded, in which the circuit board 10 is disposed behind the liquid crystal display panel 50.

As shown in FIGS. 1 to 3, the conductive terminals 21 of the flexible wiring board 20 and the conductive terminals 12 provided at two opposing ends of the circuit board 10 are connected to each other with the conductive members 30 therebetween.

As shown in FIG. 2, the circuit board 10 is disposed behind the liquid crystal display panel 50 and is composed of, for example, a printed circuit board (PCB), on which, for example, a display information processing circuit and a power supply related to the liquid crystal display panel 50, and various circuits of the device main body are mounted. The conductive terminals 12 for such various types of circuits are formed on the circuit board 10.

The flexible wiring board 20 includes wiring having a predetermined pattern formed on a flexible board, and IC chips are mounted on the wiring by various methods. As the flexible wiring board 20, a TCP (Tape Carrier Package) type flexible wiring board may be considered in which an IC chip 24 is mounted by gang bonding (metal eutectic bonding) or the like on a tape in which a wiring layer composed of a metal, such as copper (Cu), is integrally formed on a flexible board composed of, for example, a polyimide resin, using a polymeric film or the like. As the flexible wiring board 20, a flexible wiring board in which an IC chip is mounted on a flexible board provided with a wiring layer with an anisotropic conductive film therebetween may be used. The IC chip to be mounted on the flexible board is preferably a driving circuit for driving the liquid crystal display panel 50 or the like, and other electronic component chips may be further mounted by an anisotropic conductive film, soldering, or the like. The conductive terminals 21 to be brought into contact with the conductive terminals 22 on the side of the liquid crystal display panel 50 and with the conductive members 30 are formed as portions of the wiring pattern.

As described above, in the flexible wiring board 20, the conductive terminals 22 on the side of the liquid crystal panel 50 are connected to conductive terminals 53a provided over the extended section 53 of the transparent substrate 52a constituting the liquid crystal display panel 50, and the conductive terminals 21 on the side of the circuit board 10 are electrically connected to the conductive terminals 12 provided on the circuit board 10 with the conductive members 30 therebetween. Thereby, it is possible to input various types of electrical signals and a power supply from the conductive terminals 12 of the circuit board 10 on the side of the device main body through the conductive members 30, the conductive terminals 21, the IC chip 24, and the conductive terminals 22 to the liquid crystal display panel 50.

The conductive member 30, which is interposed between the flexible wiring board 20 and the circuit board 10 on the side of the device main body, electrically connects the conductive terminals 21 and the conductive terminals 12 to each other, and is an elastic conductor composed of an elastic member, etc. As shown in FIG. 4(a), the conductive member 30 includes a pair of side sections 32a and 32b extending in the longitudinal direction, insulating sections 36 formed between the side sections 32a and 32b, and a plurality of conductive sections 34 formed between the side sections 32a and 32b and between the insulating sections 36 and arrayed along the direction of the conductive terminals 21. The sides 32a and 32b and the insulating sections 36 act as elastic insulators.

In this embodiment, the conductive member 30 is bonded to the circuit board 10 with a conductive paste therebetween. That is, a conductive paste 13 is applied to the circuit board 10 in substantially the same pattern as that of the conductive terminals 12, and the conductive member 30 is connected to the conductive terminals 12 with the conductive paste 13 therebetween. The conductive paste 13 includes conductive particles which are dispersed in a binder composed of a photosetting resin or a thermosetting resin. By hardening the binder in the conductive paste 13 while the conductive member 30 is pressed onto the circuit board 10, the conductive member 30 is fixed on the circuit board 10. Since the conductive particles in the conductive paste are interposed between the conductive sections 34 of the conductive member 30 and the conductive terminals 12, the conductive sections 34 and the conductive terminals 12 are electrically connected to each other.

As the conductive particles of the conductive paste 13, plastic balls plated with Ag, Ni, or Ni—Au may be used. As the binder of the conductive paste 13, a photosetting resin, such as an epoxy resin, an acrylic resin, a modified urethane resin, or a silicone resin, or a thermosetting resin, such as an epoxy resin, an acrylic resin, a modified urethane resin, or a silicone resin, may be used.

As described above, in this embodiment, since the conductive member 30 is bonded to the circuit board 10, using the conductive paste 13, even if an impact is applied to the liquid crystal display device 1, the conductive member 30 is not detached or shifted, and thus it is possible to improve the reliability of the electrical connection. Differing from the case in which electrical connections are made only by the application of pressure, in this embodiment, the conductive member 30 is fixed on the circuit board 10 by adhesion of the conductive paste 13, and thus the connecting state can be stabilized. Moreover, since the connecting area is covered by the conductive paste 13, it is possible to efficiently inhibit changes of the connection over time.

Instead of the conductive paste 13 having isotropic conductivity, an anisotropic conductive paste may be used. In such a case, it is not necessary to pattern the conductive paste in a pattern corresponding to that of the conductive terminals 12, and the conductive paste is applied so as to cover the region containing the conductive terminals 12, and thus it is possible to eliminate troublesome steps, such as precise alignment, from the process of applying the conductive paste. Instead of the anisotropic conductive paste, an anisotropic conductive film (ACF) may be used. In such a case, after the anisotropic conductive film is applied, the conductive member 30 is thermally compressed to the conductive terminals 12 with the anisotropic conductive film therebetween. Since the resin contained in the anisotropic conductive film is cured by the thermal compression or is hardened by cooling after the thermal compression, the conductive member 30 is physically fixed, and also since the conductive particles contained in the anisotropic conductive film are interposed between the conductive terminals 12 and the conductive sections 34 of the conductive member 30, the conductive terminals 12 and the conductive sections 34 are electrically connected to each other.

Additionally, as the conductive member 30, for example, a conductive member formed of an anisotropic conductive rubber, etc., a conductive member in which conductive particles are dispersed in a rubber, a conductive member in which a metallic thin wire is fixed in a rubber, a member in which conductors are formed in a striped arrangement (conductors and elastic members are alternately arranged), or the like may be used. For example, as shown in FIG. 4(b), a conductive member 70 may be used in which a plurality of metallic wires 72 composed of gold or the like are embedded in an elastic insulator 74. Furthermore, as shown in FIG. 4(c) a conductive member 80 may be used in which a plurality of metallic wires 82 composed of gold or the like, with a substantially semicircular cross section, are arranged on the outer periphery of an elastic insulating section 84 composed of a rubber or the like. In view of strength, a conductive member with a semicircular cross section is preferable.

FIG. 5(a) is a perspective view showing a state in which the conductive member 80 shown in FIG. 4(c) is bonded to the circuit board 10 using an isotropic conductive paste, and FIG. 5(b) is a sectional view taken along the line B—B of FIG. 5(a). As shown in FIGS. 5(a) and 5(b), the conductive member 80 is bonded to the circuit board 10 by a binder (not shown in the drawing) in a conductive paste 15 which bond the conductive terminals 12 and the metallic wires 82, and also the metallic wires 82 of the conductive member 80 and the conductive terminals 12 of the circuit board 10 are electrically connected to each other by conductive particles (not shown in the drawing) in the conductive paste 15.

As shown in FIG. 5(c), an anisotropic conductive film 15A may be used to bond the conductive member 80 to the circuit board 10. In such a case, after the anisotropic conductive film 15A is applied so as to cover the conductive terminals 12, the conductive member 80 is thermally compressed to the circuit board 10, and thus the conductive member 80 and the circuit board 10 can be bonded to each other by the anisotropic conductive film 15A. Also, the metallic wires 82 and the conductive terminals 12 are electrically connected to each other by conductive particles contained in the anisotropic conductive film 15A. Using an anisotropic conductive paste instead of the anisotropic conductive film 15A, the anisotropic conductive paste may be applied so as to cover the region containing the conductive terminals 12.

As shown in FIG. 2, the structural member 40 acts as a light guide 44 for guiding incident light from the light source 46, such as an LED, toward the back surface of the liquid crystal display panel 50, and also acts as a member for supporting the liquid crystal display panel 50. Furthermore, the structural member 40 has fixing sections 48 which protrude downward. The fixing sections 48 of the structural member 40 are fitted into the circuit board 10 through openings 14 of the circuit board 10 on the side of device main body, and thus the structural member 40 and the circuit board 10 are combined. Between the structural member 40 and the circuit board 10 which are combined by the fixing sections 48, the spacer members 60, the flexible wiring board 20, and the conductive members 30 (80) are disposed in that order from the side of the liquid crystal display panel 50. Thus, it is possible to retain the circuit board 10, the conductive members 30 (80), the flexible wiring board 20, the spacer members 60, etc., in a block.

The spacer members 60 are interposed between the structural member 40 and the flexible wiring board 20 as shown in FIG. 2, and are composed of an elastic member, such as a rubber member composed of a silicone rubber or the like, a sponge member, a tube member, an elastic member into which air is injected, or a plastic member. A plurality of linear protrusions are formed on the contact surface of the spacer member 60 on the side of the flexible wiring board 20. The thickness of the spacer member 60 is set larger than the space between the structural member 40 and the flexible wiring board 20. By subjecting the spacer members 60 to elastic deformation, the contact pressure of the conductive members 30 (80) to the flexible wiring board 20 is increased using the elastic force, thus improving the reliability of the connection.

The conductive members 30 (80), which are also composed of elastic members, elastically deform depending on the pressure applied to the flexible wiring board 20 and the circuit board 10, and the contact pressure of the contacting area is increased by the elastic force. The applied pressure is due to the structural member 40 and the spacer members 60.

The liquid crystal display panel 50 includes, as shown in FIG. 2, a liquid crystal enclosed between the two transparent substrates (polysilicon glass substrates) 52a and 52b, and thus at least a dot matrix liquid crystal display panel is constructed. The liquid crystal display panel 50 is provided with polarizers 54 and 55 on the upper and lower surfaces, respectively. Circuits which are not mounted on the liquid crystal display panel 50 and the flexible wiring board 20 can be mounted on the circuit board 10 as external circuits. Additionally, a driving circuit or a display information processing circuit may be formed on one of the transparent substrates constituting the liquid crystal display panel.

In this example, the back surface of the liquid crystal display panel 50 and the light guide 44 of the structural member 40 are fixed to each other by a double-sided adhesive tape 56, etc.

Next, a method for fabricating the liquid crystal display device 1 will be described with reference to FIGS. 1 to 3.

First, as shown in FIG. 3, the liquid crystal display panel 50 and the flexible wiring board 20 are connected to each other while the conductive terminals 53a formed on the extended section 53 of the transparent substrate 52a of the liquid crystal display panel 50 is electrically connected to the conductive terminals 22 on the liquid crystal panel side of the flexible wiring board 20. As shown in FIG. 1, the back surface of the liquid crystal display panel 50 and the light guide 44 of the structural member 40 are then fixed using double-sided adhesive tapes 56.

Meantime, an isotropic conductive paste is applied to the circuit board 10 in substantially the same pattern as that of the conductive terminals 12. In order to apply the conductive paste, various types of printing, such as screen printing, offset printing, and so-called "intaglio printing", may be used, or a method using a dispenser, an ink-jet method, etc., may be employed. Next, after the conductive members 30 are aligned so that the conductive sections 34 of the conductive member 30 are opposed to the conductive terminals 12 of the circuit board 10, the conductive paste is hardened by the irradiation of light, such as ultraviolet light, or by heating the conductive paste. Thus, the conductive members 30 are bonded to the circuit board 10, and the conductive sections 34 of the conductive members 30 and the conductive terminals 12 of the circuit board 10 are electrically connected to each other. When the binder resin contained in the conductive paste is a thermoplastic resin, the binder resin is hardened by cooling the conductive paste, and thus the conductive members 30 are bonded to the circuit board 10.

As shown by an arrow in FIG. 3, the flexible wiring board 20 is folded toward the back surface of the liquid crystal display panel 50. Herein, as shown in FIGS. 1 and 2, since the structural member 40 is disposed behind the liquid crystal display panel 50, when the flexible wiring board 20 is folded, the flexible wiring board 20 is placed below the structural member 40, and also the flexible wiring board 20 faces the circuit board 10. The spacer members 60 are disposed between the folded flexible wiring board 20 and the structural member 40 at positions corresponding to the positions in which the conductive members 30 are placed.

Meantime, on the surface of the circuit board 10 provided with the conductive terminals 12, the conductive members 30 are placed between the conductive terminals 21 of the folded flexible wiring board 20 and the conductive terminals 12 of the circuit board 10.

In such a state, the fixing sections 48 of the structural member 40 are fitted and fixed into the circuit board 10. In this embodiment, the fixing sections 48 of the structural member 40 are inserted through the openings 14 made in the circuit board 10, and by fitting claws 48a provided on the tips of the fixing sections 48 to the back surface of the circuit board 10, the structural member 40 and the circuit board 10 are fixed.

When the anisotropic conductive film 15A (refer to FIG. 5(c)) is used instead of the isotropic conductive paste, after the anisotropic conductive film 15A is applied so as to cover the conductive terminals 12, the conductive member 30 is compressed to the circuit board 10 so as to sandwich the anisotropic conductive film 15A, and simultaneously the anisotropic conductive film 15A is heated. When the binder resin contained in the anisotropic conductive film 15A is a thermosetting resin, after the anisotropic conductive film 15A moderately flows due to thermal compression, the thermosetting resin is thermally cured. When the binder resin contained in the anisotropic conductive film 15A is a thermoplastic resin, after the anisotropic conductive film 15A moderately flows due to thermal compression, the thermoplastic resin is hardened by cooling. Conductive particles are interposed between the conductive sections 34 of the conductive member 30 and the conductive terminals 12, and the conductive sections 34 and the conductive terminals 12 are electrically connected to each other. When an anisotropic conductive paste is used, instead of applying the anisotropic conductive film, after the anisotropic conductive paste is applied so as to cover the conductive terminals 12, the conductive member 30 can be bonded to the circuit board 10 by thermal compression in a manner similar to that when the anisotropic conductive film is used.

Although the conductive member 30, 70, or 80 is bonded to the circuit board 10 using the conductive paste or the anisotropic conductive film in the embodiment described above, the object to which a conductive member is to be bonded is not specifically limited. For example, a conductive member may be fixed on terminals of a liquid crystal display panel corresponding to the liquid crystal display panel 50, and an FPC, etc., may be connected to the liquid crystal display panel 50 through the conductive member. The conductive member 30, 70, or 80 may be fixed using a conductive paste, etc., on a COG type liquid crystal display panel in which an IC for driving a liquid crystal is directly mounted on a substrate, and external circuits and the liquid crystal display panel may be connected to each other through the conductive member 30, 70, or 80.

Second Embodiment

A second embodiment will be described with reference to FIGS. 6 to 8, in which a connecting structure in accordance with the present invention is applied to a so-called "COG (Chip On Glass) type" liquid crystal display device.

Figure 6:
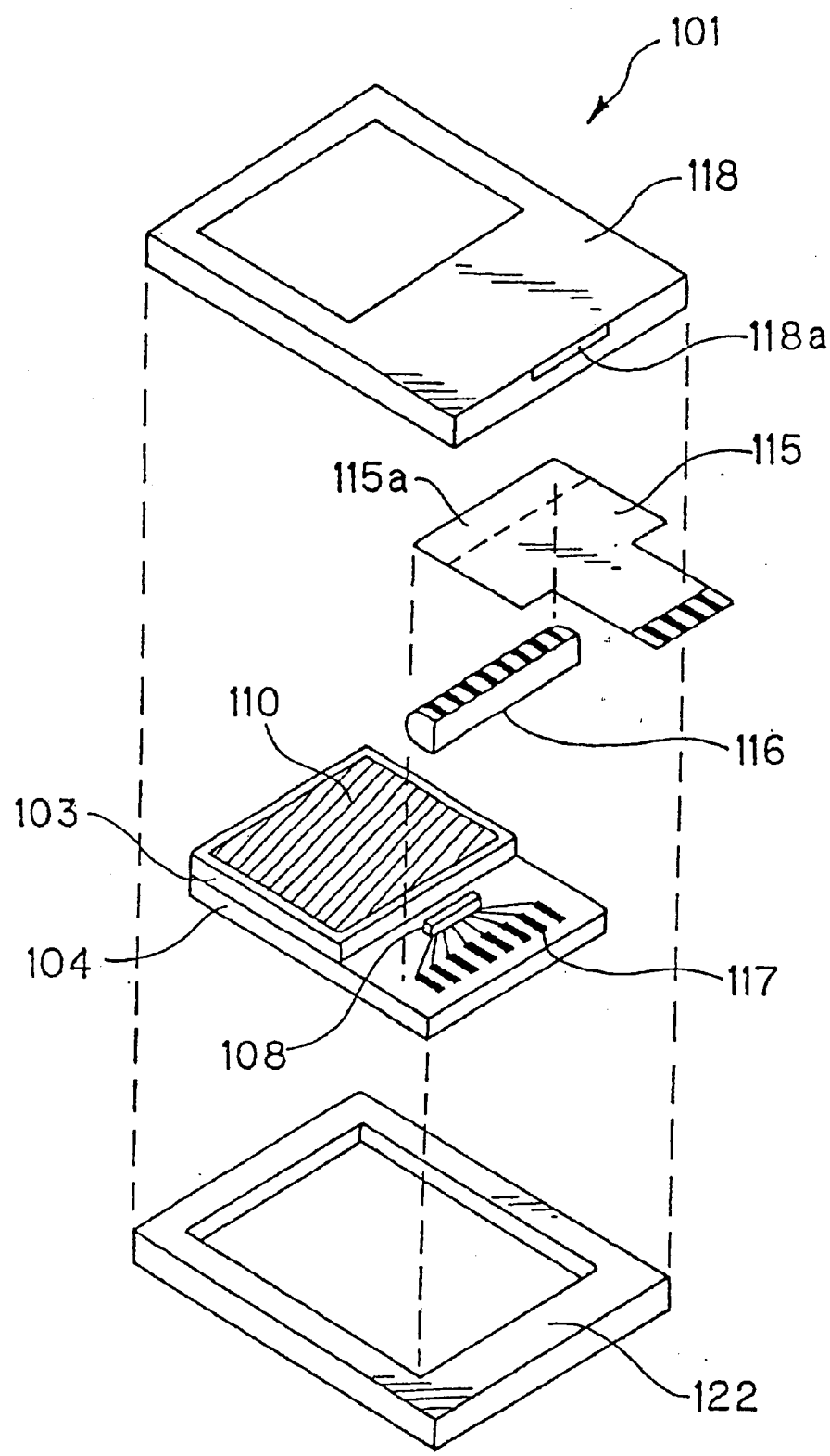
FIG. 6 is an assembly view of a liquid crystal display device.
Figure 7:
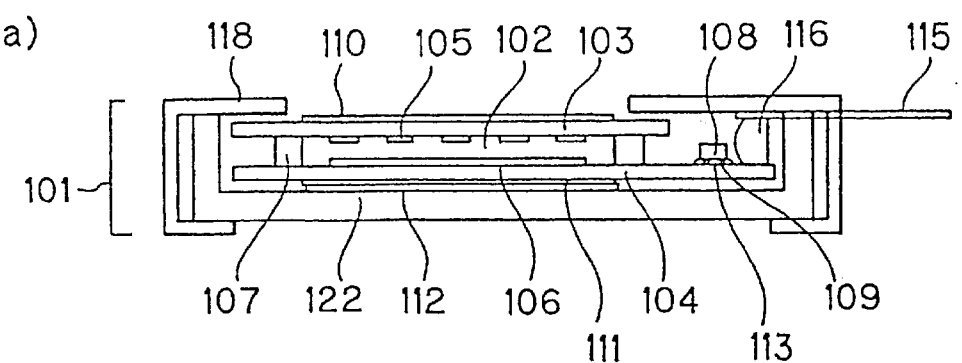
FIGS. 7(a) and 7(b) shows the liquid crystal display device shown in FIG. 6.
Figure 7:
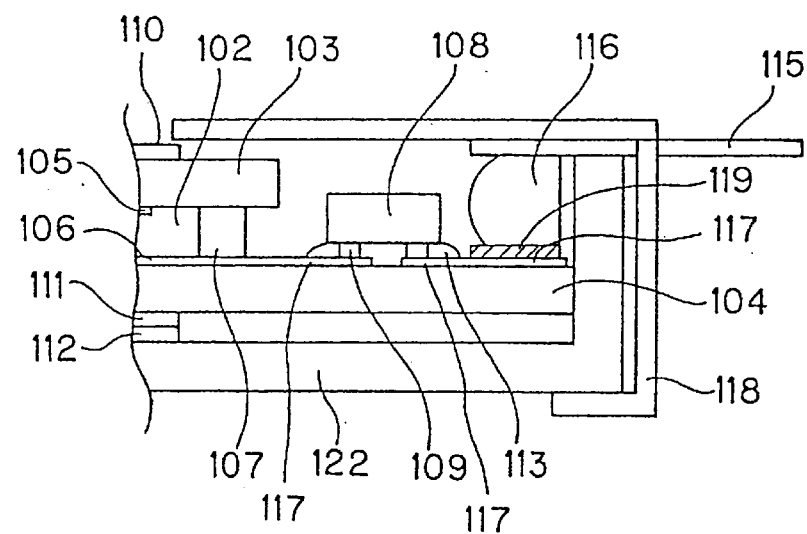
Figure 8:
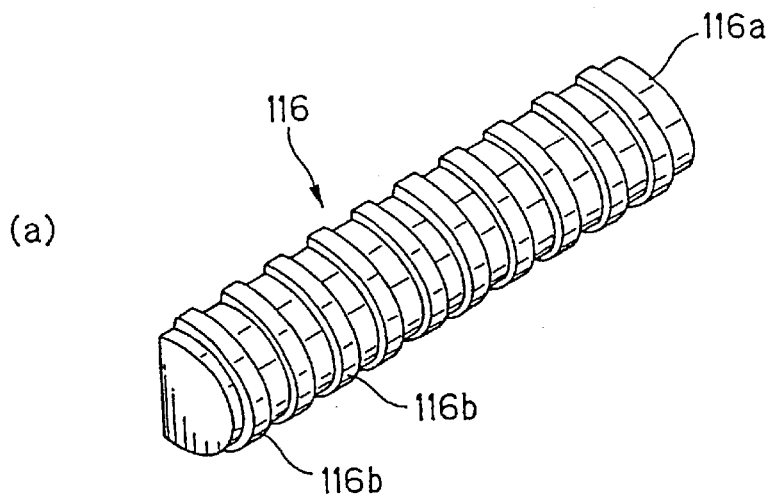
FIGS. 8(a) and 8(b) shows a rubber connector and a method for bonding the rubber connector.
Figure 8:
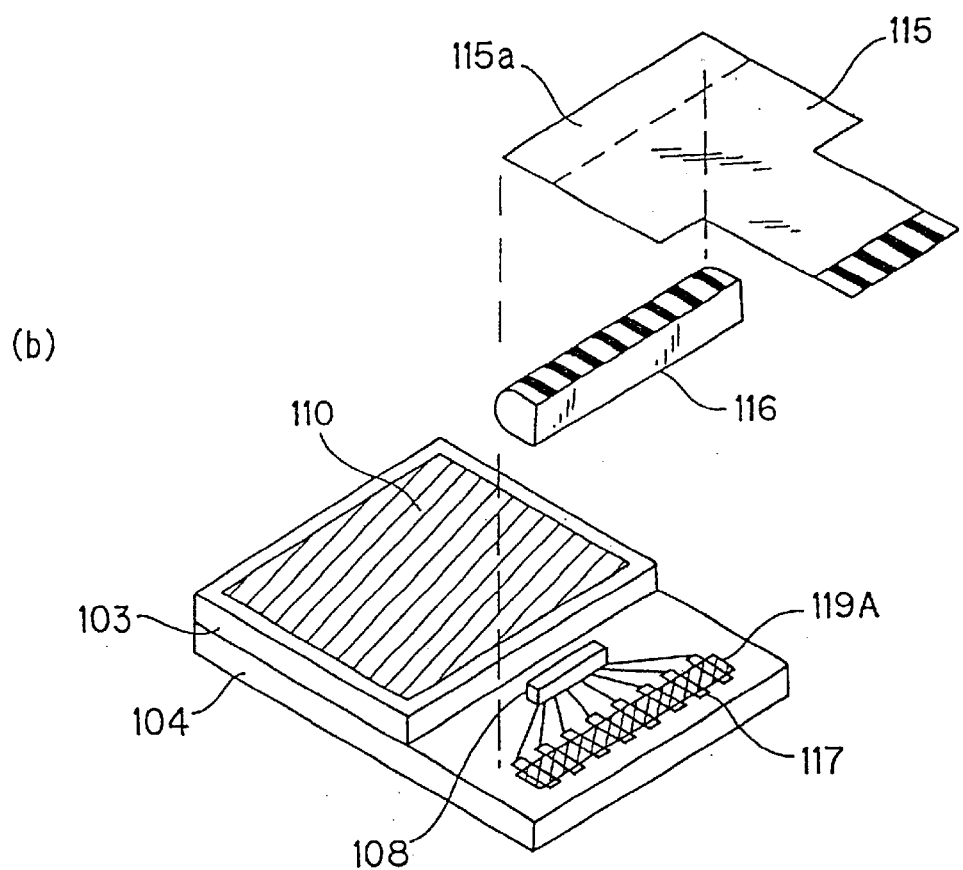

FIG. 6 is an assembly view of a liquid crystal display device, FIG. 7(a) is a sectional view of the liquid crystal display device, FIG. 7(b) is a partially enlarged view of FIG. 7(a), and FIG. 8 is a perspective view showing a rubber connector (elastic member).

As shown in FIGS. 6 to 8, a liquid crystal display device 101 includes a substrate 103 provided with a transparent electrode layer 105 on one surface, and a substrate 104 provided with a transparent electrode layer 106 on one surface. The substrate 103 and the substrate 104 are bonded to each other by a sealant 107 so that the transparent electrode layer 105 and the transparent electrode layer 106 are opposed to each other, and a liquid crystal composition 102 is enclosed between the substrate 103 and the substrate 104.

A portion of the substrate 104 (the right end section in FIG. 7(a)) extends beyond the substrate 103, and a liquid crystal-driving IC 108 is mounted in this region using an anisotropic conductive film (ACF) 113, thus constituting a so-called "COG type" liquid crystal display device. As shown in FIG. 7(b), bumps 109 of the liquid crystal-driving IC 108 are connected to terminals 117 on the substrate 104 with the ACF 113 therebetween.

The terminals 117 are led onto the end of the substrate 104 (the right end in FIG. 7(a)), and a rubber connector 116 as a conductive member is bonded onto the terminals 117 with an isotropic conductive paste 119, which is either photosetting or thermosetting, therebetween. The conductive paste 119 is applied in substantially the same pattern as that of the terminals 117, by hardening the conductive paste 119 by light or heat while the rubber connector 116 is pressed onto the substrate 104, the rubber connector 116 is fixed on the substrate 104. As shown in FIG. 8(a), the rubber connector 116 includes an elastic insulating section 116a composed of a rubber and metallic wires 116b set around the insulating section 116a, and the rubber connector 116 is fixed at the position in which the metallic wires 116b are opposed to the terminals 117. The conductive paste can be applied in the same method as that in the first embodiment.

Additionally, instead of applying the isotropic conductive paste in substantially the same pattern as that of the terminals 117, an anisotropic conductive paste may be applied so as to cover the region in which the terminals 117 are formed. Alternatively, as shown in FIG. 8(b), using an anisotropic conductive film 119A, after the anisotropic conductive film 119A is applied so as to cover the region in which the terminals 117 are formed, by pressing the rubber connector 116 onto the substrate 104 while heating the anisotropic conductive film 119A, the rubber connector 116 and the substrate 104 may be bonded by thermal compression.

The substrate 103 and the substrate 104 are supported by being sandwiched between a shielding member 118 and a holding member 122. A slit 118a is formed in the shielding member 118, an FPC (flexible printed circuit) 115 which is inserted through the slit 118a is sandwiched between the shielding member 118 and the rubber connector 116, and the rubber connector 116 is elastically deformed. Due to the resilience of the rubber connector 116, terminals 115a provided on the FPC 115 are pressed onto the metallic wires 116b of the rubber connector 116, and thus the terminals 115a of the FPC 115 and the terminals 117 of the substrate 104 are electrically connected to each other with the metallic wires 116b therebetween.

In the second embodiment, since the rubber connector 116 is bonded to the substrate 104 using the isotropic conductive paste, the anisotropic conductive paste, or the anisotropic conductive film, even if an impact is applied to the liquid crystal display device 101, the rubber connector 116 which is a conductive member is not detached or shifted, and thus it is possible to improve the reliability of the electrical connection. Differing from the case in which electrical connections are made only by the application of pressure, in this embodiment, the rubber connector 116 is fixed on the substrate 104 by adhesion of the conductive paste, etc., and thus the connecting state can be stabilized. Moreover, since the connecting area is covered by the conductive paste, it is possible to efficiently inhibit changes of the connection over time.

In this embodiment, as a substrate having terminals to be connected to a conductive member, a substrate of a liquid crystal display device is used. However, the present invention is not limited thereto, and as the substrate to be connected to the conductive member, an electro-optical panel, such as a plasma display panel, an FED panel, or an organic/inorganic electroluminescence panel, may be used.

Figure 9:
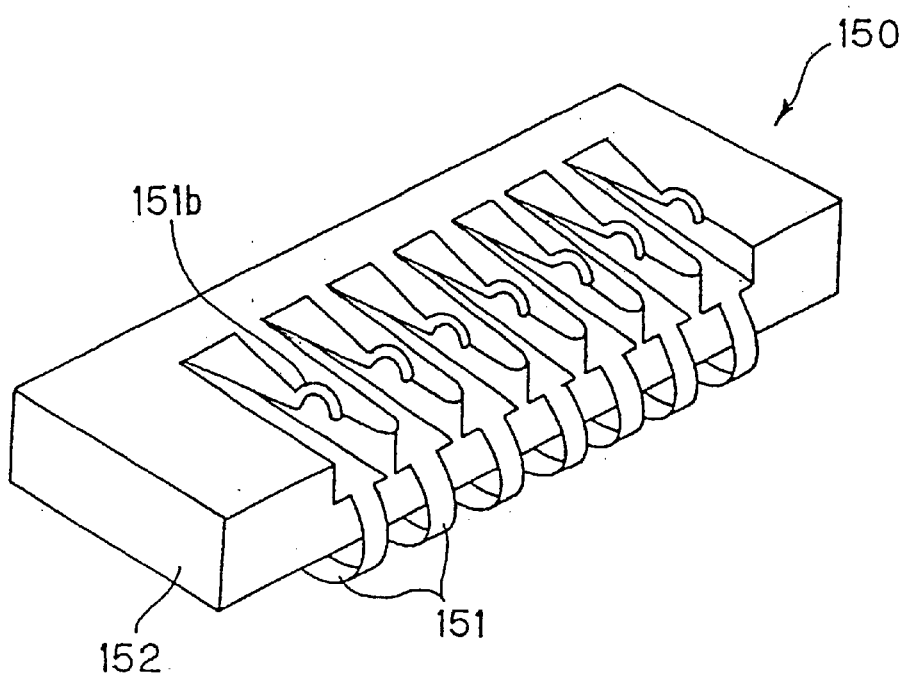
FIG. 9 is a perspective view of a spring connector.

Next, a spring connector, which is another example of a conductive member, will be described with reference to FIGS. 9 to 11. FIG. 9 is a perspective view of a spring connector, FIG. 10(a) is a top plan view of the spring connector shown in FIG. 9, FIG. 10(b) is a bottom plan view of the spring connector, and FIG. 10(c) is a sectional view taken along the line X—X of FIG. 10(a).

Figure 10:
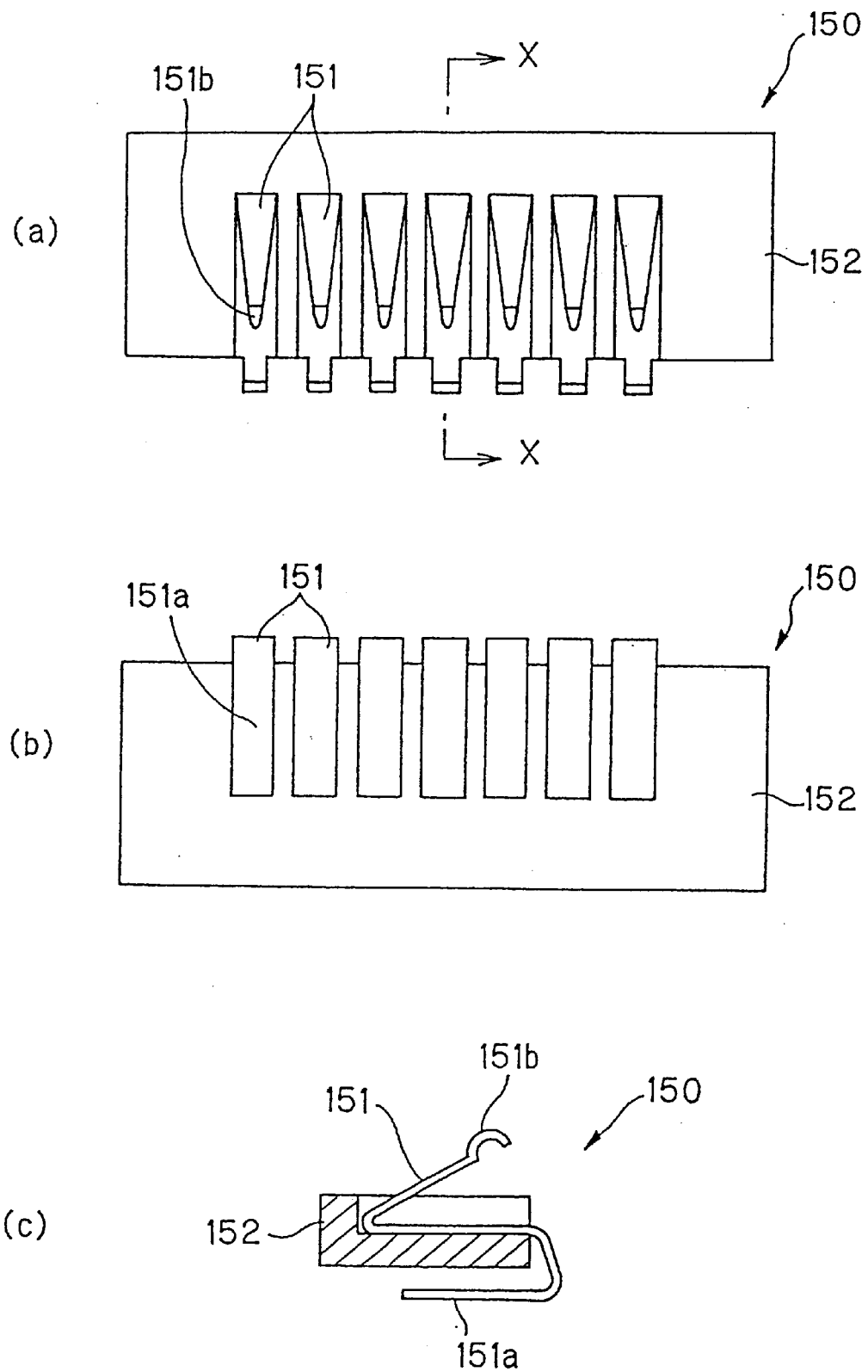
FIGS. 10(a) to 10(c) are diagrams showing a spring connector.

As shown in FIGS. 9 and 10, a spring connector 150 includes a plurality of substantially S-shaped metallic spring members 151 and an insulating case 152 composed of an organic material for supporting the spring members 151. The spring members 151 having conductivity are contained in the case 152 while being insulated from each other, and the spring members 151 are elastically deformable while being supported by the case 152. The material for the case 152 has heat resistance so as to resist heat when the spring connector 150 and terminals on a substrate is bonded to each other by thermal compression with a conductive adhesive therebetween.

FIGS. 11(a) and 11(b) show a state in which the rubber connector 150 is used instead of the rubber connector 116 (refer to FIG. 7(b)) in the second embodiment. FIG. 11(a) is a sectional view corresponding to FIG. 7(b), and FIG. 11(b) is a diagram viewed from the line B—B of FIG. 11(a).

As shown in FIGS. 11(a) and 11(b), ends 151a of the spring members 151 exposed from the case 152 are connected to the terminals 117 with an isotropic conductive paste 119 therebetween. Ends 151b of the spring members 151 are pressed onto the terminals 115a of the FPC 115 due to resilience of the elastically deformed spring member 151.

In a manner similar to that in the second embodiment, the conductive paste 119 is applied in substantially the same pattern as that of the terminals 117, and by hardening the conductive paste 119 by light or heat while the spring connector 150 is pressed onto the substrate 104, the spring connector 150 is fixed on the substrate 104.

FIG. 11(c) is a diagram which shows a case in which an anisotropic conductive film is used instead of the isotropic conductive paste. An anisotropic conductive film 119A is placed on the substrate 104 so as to cover the aligned terminals 117, and the terminals 117 and the ends 151a of the spring members 151 which are opposed to each other are connected to each other by conductive particles contained in the anisotropic conductive film 119A. In such a case, after the anisotropic conductive film 119A is applied so as to cover the region in which the terminals 117 are formed, by pressing the spring connector 150 onto the substrate 104 while heating the anisotropic conductive film 119A, the spring connector 150 and the substrate 104 can be bonded to each other by thermal compression.

Figure 11:
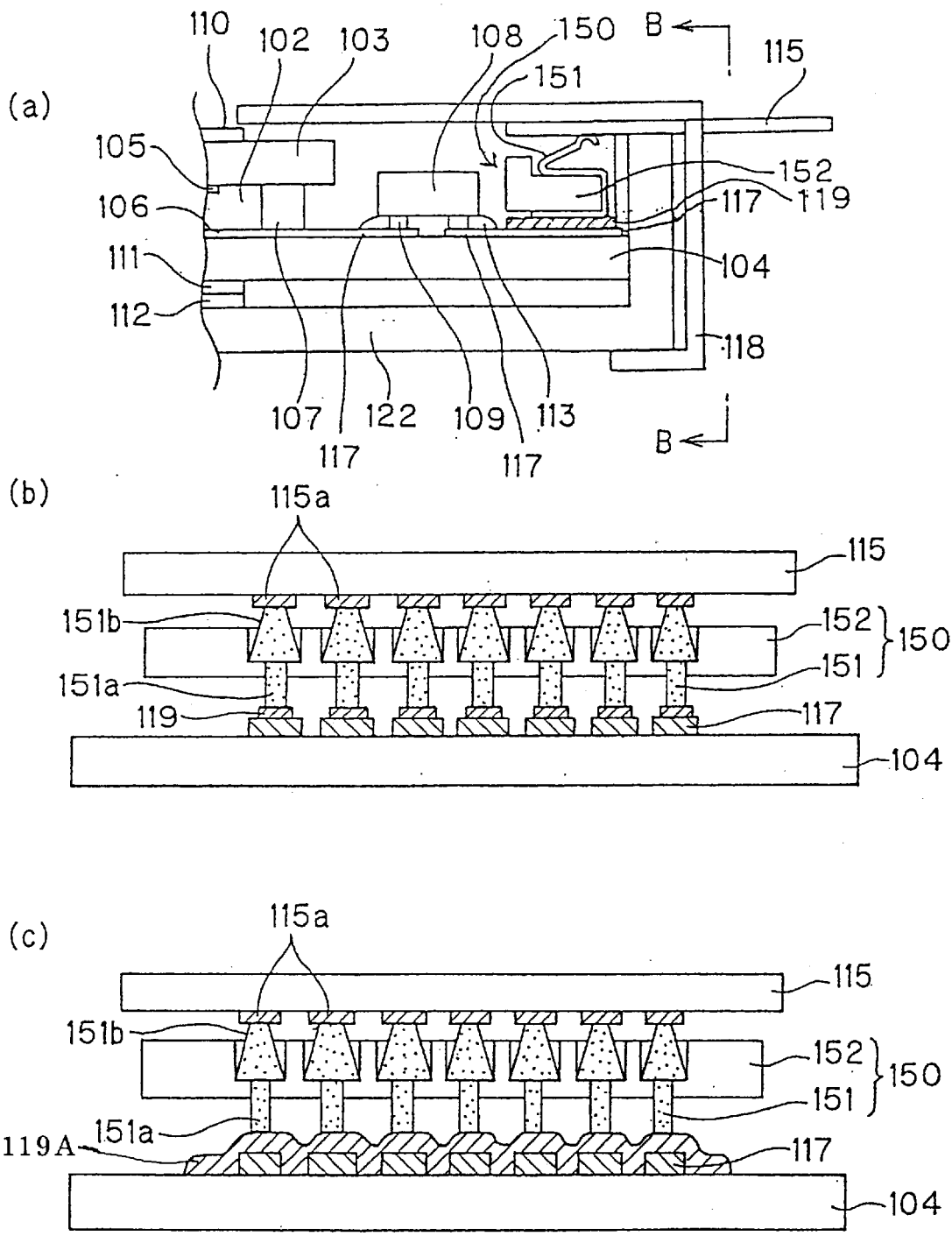
FIGS. 11(a) to 11(c) are diagrams showing a case in which a spring connector is used instead of a rubber connector in the second embodiment.

With respect to the spring connector as shown in FIGS. 9 to 11, generally, since the size in the thickness direction (the distance between the substrate 104 and the FPC 115 in FIGS. 11(a) to 11(c)) can be reduced in comparison with the rubber connector, it is possible to reduce the size in the corresponding direction in a connecting structure, an electro-optical device, or an electronic apparatus. Also, since the case 152 has a relatively high rigidity and the case 152 can be retained in the alignment process, it is possible to align the spring connector 150 with high accuracy. Therefore, when the spring connector is used, in comparison with the case in which the rubber connector is used, it is easier to align the conductive sections (spring members) of the connector with the terminals on the substrate.

Embodiment of Electronic Apparatus

Figure 12:
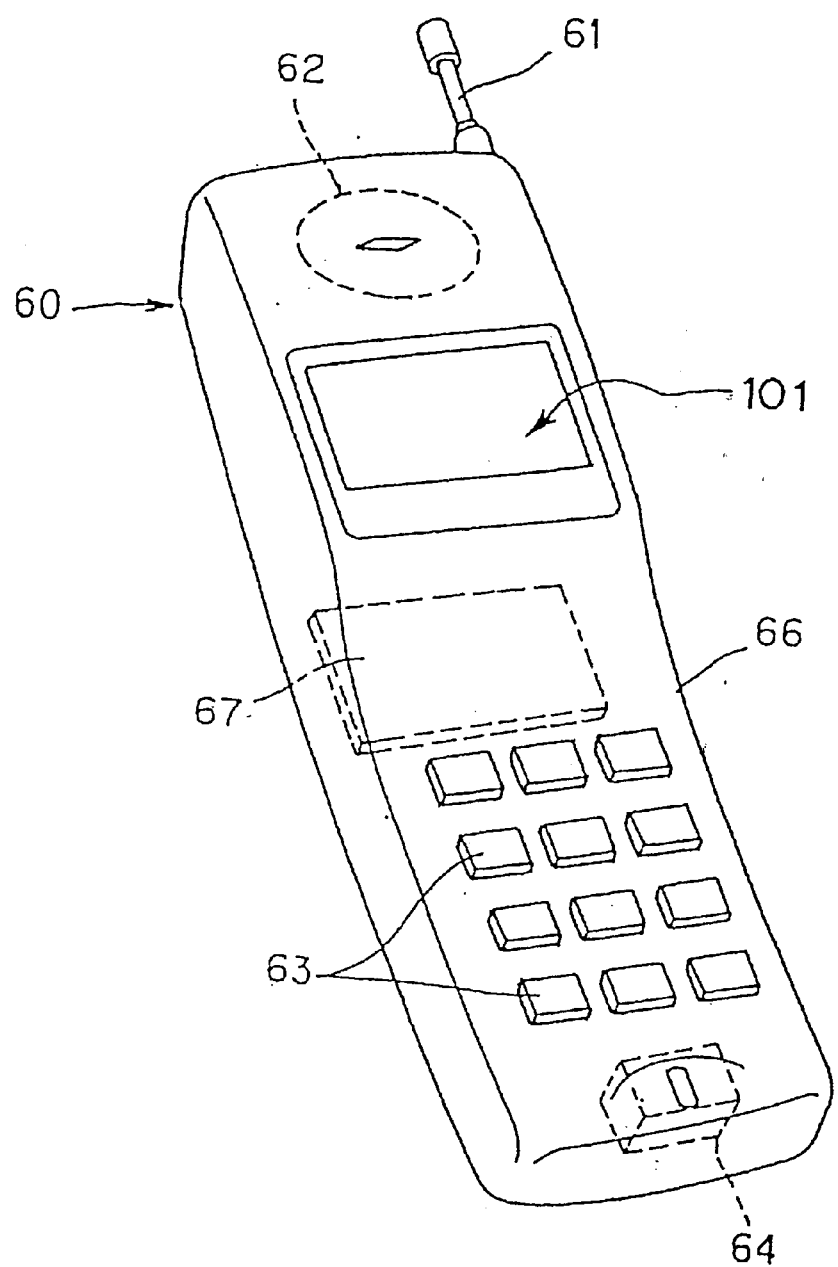
FIG. 12 shows a mobile telephone as an electronic apparatus of the present invention.

FIG. 12 shows a mobile telephone as an embodiment of an electronic apparatus of the present invention. In a mobile telephone 60, various components, such as an antenna 61, a speaker 62, the liquid crystal display device 101 described above, a key switch 63, and a microphone 64, are contained in an outer case 66 as a housing. A control circuit board 67 mounted with a control circuit for controlling the individual components is also provided in the outer case 66.

In the mobile telephone 60, signals inputted through the key switch 63 and the microphone 64 and data received by the antenna 61 are inputted into the control circuit on the control circuit board 67. The control circuit displays images, such as numerals, characters, and pictures, based on the various input data, and furthermore data is sent via the antenna 61.

Although the mobile telephone is described as an example, the present invention is also applicable to other electronic apparatuses.

What is claimed is:

1. A connecting structure comprising:

a first substrate provided with a first terminal;

a second substrate provided with a second terminal;

an elastic conductive member interposed between the first substrate and the second substrate;

the elastic conductive member including:

a pair of flexible, spaced apart side sections extending in a longitudinal direction of the elastic conductive member;

a plurality of spaced apart conductive sections axially aligned between the side sections; and a plurality of insulating sections interspaced between said conductive sections and axially aligned between the side sections; and a conductive adhesive disposed between the first terminal and the elastic conductive member, the conductive adhesive including at least one of a hardened conductive paste and an anisotropic conductive film;

wherein one of the conductive sections is connected to the first terminal via the conductive adhesive; and wherein one of the conductive sections is pressed onto the second terminal by resilience due to elastic deformation of the elastic conductive member so that one of the conductive sections is connected to the second terminal.

2. The connecting structure according to claim 1, wherein the conductive member comprises an elastic insulating section, and the insulating section is provided on the periphery of the conductive section.

3. The connecting structure according to claim 1, wherein the conductive member comprises an elastic insulating section, and the conductive section is embedded in the insulating section.

4. The connecting structure according to claim 1, wherein the conductive adhesive is a hardened conductive paste.

5. The connecting structure according to claim 4, wherein the conductive paste is an isotropic conductive paste.

6. The connecting structure according to claim 4, wherein the conductive paste is an anisotropic conductive paste.

7. The connecting structure according to claim 4, wherein the connecting structure is fabricated by a method comprising the steps of applying the conductive paste on the first terminal; and hardening the conductive paste while the conductive member is pressed onto the first terminal.

8. The connecting structure according to claim 1, wherein the conductive adhesive is an anisotropic conductive film.

9. The connecting structure according to claim 8, wherein the connecting structure is fabricated by a method comprising the steps of placing the conductive film on the first terminal; and hardening or curing the anisotropic conductive film while the conductive member is pressed onto the first terminal with the anisotropic conductive film therebetween.

10. The connecting structure according to claim 1, wherein the first substrate is a substrate constituting an electro-optical panel.

11. An electro-optical device comprising:

a first substrate constituting an electro-optical panel provided with a first terminal;

a second substrate provided with a second terminal; and an elastic conductive member interposed between the first substrate and the second substrate;

the elastic conductive member including:

a pair of flexible, spaced apart side sections extending in a longitudinal direction of the elastic conductive member;

a plurality of spaced apart conductive sections axially aligned between the side sections; and a plurality of insulating sections interspaced between said conductive sections and axially aligned between the side sections; and a conductive adhesive disposed between the first terminal of the first substrate and the elastic conductive member, the conductive adhesive including at least one of a hardened conductive paste and an anisotropic conductive film;

wherein one of the conductive sections is connected to the first terminal via the conductive adhesive; and wherein one of the conductive sections is pressed onto the second terminal of the second substrate by resilience due to elastic deformation of the elastic conductive member so that one of the conductive sections is connected to the second terminal.

12. The electro-optical device according to claim 11, wherein the conductive section is pressed onto the second terminal by resilience due to elastic deformation of the conductive member so that the conductive section is connected to the second terminal, thereby electrically connecting the first terminal and the second terminal to each other.

13. The electro-optical device according to claim 11, wherein the conductive member comprises an elastic insulating section, and the insulating section is provided on the periphery of the conductive section.

14. The electro-optical device according to claim 11, wherein the conductive member comprises an elastic insulating section, and the conductive section is embedded in the insulating section.

15. The electro-optical device according to claim 11, wherein the conductive adhesive is a hardened conductive paste.

16. The electro-optical device according to claim 15, wherein the conductive paste is an isotropic conductive paste.

17. The electro-optical device according to claim 15, wherein the conductive paste is an anisotropic conductive paste.

18. The electro-optical device according to claim 15, wherein the electro-optical device is fabricated by a method comprising the steps of applying the conductive paste on the first terminal; and hardening the conductive paste while the conductive member is pressed onto the first terminal.

19. The electro-optical device according to claim 11, wherein the conductive adhesive is an anisotropic conductive film.

20. The electro-optical device according to claim 19, wherein the electro-optical device is fabricated by a method comprising the steps of placing the conductive film on the first terminal; and hardening or curing the anisotropic conductive film while the conductive member is pressed onto the first terminal with the anisotropic conductive film therebetween.

21. An electronic apparatus comprising an electro-optical device according to claim 11.

* * * * *